United States Patent
Jung et al.

(10) Patent No.: US 7,582,925 B2
(45) Date of Patent: Sep. 1, 2009

(54) INTEGRATED CIRCUIT DEVICES INCLUDING INSULATING SUPPORT LAYERS

(75) Inventors: Seung-ok Jung, Incheon Metropolitan (KR); Il-young Moon, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 11/476,459

(22) Filed: Jun. 28, 2006

(65) Prior Publication Data

US 2006/0292812 A1    Dec. 28, 2006

(30) Foreign Application Priority Data

Jun. 28, 2005    (KR) ............... 10-2005-0056461

(51) Int. Cl.
*H01L 27/108* (2006.01)
*H01L 29/76* (2006.01)
*H01L 29/94* (2006.01)
*H01L 31/119* (2006.01)

(52) U.S. Cl. ............ 257/296; 257/303; 257/306
(58) Field of Classification Search ............ 257/296, 257/303–304, 306, E27.086, E27.087, E27.088
See application file for complete search history.

(56) References Cited

U.S. PATENT DOCUMENTS

| | | | | |
|---|---|---|---|---|
| 6,809,364 B2 * | 10/2004 | Matsuoka et al. | ............ | 257/296 |
| 6,902,998 B2 * | 6/2005 | Lee et al. | ............ | 438/616 |
| 7,183,603 B2 * | 2/2007 | Park | ............ | 257/298 |
| 7,205,219 B2 * | 4/2007 | Oh et al. | ............ | 438/597 |
| 2003/0218201 A1 * | 11/2003 | Tsunemine | ............ | 257/306 |
| 2005/0218440 A1 * | 10/2005 | Park | ............ | 257/298 |

FOREIGN PATENT DOCUMENTS

| | | |
|---|---|---|
| KR | 1020000000633 | 1/2000 |
| KR | 2002-0001459 | 1/2002 |
| KR | 2004-0060139 | 7/2004 |

* cited by examiner

*Primary Examiner*—Hoai V Pham
(74) *Attorney, Agent, or Firm*—Myers Bigel Sibley & Sajovec, P.A.

(57) ABSTRACT

An integrated circuit device may include a substrate, a plurality of storage electrode landing pads on the substrate, and a plurality of storage electrodes. Each of the plurality of storage electrodes may be on a portion of a respective one of the plurality of storage electrode landing pads. In addition, an insulating support layer may be on the substrate, on portions of the storage electrode landing pads that are free of the storage electrodes, and on portions of sidewalls of storage electrodes. Moreover, portions of sidewalls of the storage electrodes may be free of the insulating support layer. Related methods and structures are also discussed.

16 Claims, 7 Drawing Sheets

INTEGRATED CIRCUIT DEVICES INCLUDING INSULATING SUPPORT LAYERS

RELATED APPLICATION

This application claims the benefit of priority from Korean Patent Application No. 10-2005-0056461 filed on Jun. 28, 2005 in the Korean Intellectual Property Office, the disclosure of which is incorporated herein by reference in its entirety.

FIELD OF THE INVENTION

The present invention relates to electronics, and more particularly, to semiconductor integrated circuit devices including capacitors and related methods.

BACKGROUND

As the scale of integration of semiconductor integrated circuit devices increases, an area available for forming a capacitor decreases. Even when a unit device is scaled down to sub-100 nm, however, improved refresh characteristics may be needed. Increased capacitance may thus be needed to provide good refresh characteristics. A method of increasing capacitance may be to increase the height of a storage node of a capacitor. As the height of a storage node increases, however, a likelihood of defect formation due to collapse of the storage node may increase.

SUMMARY

According to some embodiments of the present invention, an integrated circuit device may include a substrate, a plurality of storage electrode landing pads on the substrate, and a plurality of storage electrodes. Each of the plurality of storage electrodes may be on a portion of a respective one of the plurality of storage electrode landing pads. In addition, an insulating support layer may be on the substrate, on portions of the storage electrode landing pads that are free of the storage electrodes, and on portions of sidewalls of storage electrodes. Moreover, portions of sidewalls of the storage electrodes may be free of the insulating support layer.

Each of the storage electrode landing pads may extend onto a portion of a sidewall of the respective storage electrode. Each of the storage electrodes may also extend beyond an edge of the respective storage electrode landing pad in a direction parallel to a surface of the substrate.

The integrated circuit device may also include a capacitor dielectric layer on portions of the storage electrodes that are free of the insulating support layer, and a plate electrode on the capacitor dielectric layer and on the insulating support layer. Moreover, the capacitor dielectric layer may be between the plate electrode and the storage electrodes.

First and second adjacent bit lines may be on the substrate, and the first and second adjacent bit lines may be parallel. In addition, the plurality of storage electrode landing pads may include first and second adjacent storage electrode landing pads between the first and second adjacent bit lines. A first one of the plurality of storage electrodes may be on an end of the first storage electrode landing pad adjacent the first bit line, and a second one of the plurality of storage electrodes may be on an end of the second storage electrode landing pad adjacent the second bit line.

The first and second storage electrode landing pads may be orthogonal with respect to the first and second adjacent bit lines. In addition, a first active region of the substrate may be electrically coupled to the first storage electrode landing pad, and a second active region of the substrate may be electrically coupled to the second storage electrode landing pad, with the first and second active regions being separated by isolation regions of the substrate. Moreover, a word line may be on the substrate, the wordline may be orthogonal with respect to the first and second bit lines, and the wordline may cross the first and second active regions. The wordline may cross the first and second active regions at a non-orthogonal angle, and the first and second storage electrodes may be respectively aligned with portions of the first and second active regions. The first and second storage electrodes may be respectively offset relative to portions of the first and second active regions.

An active region of the substrate may be surrounded by isolation regions of the substrate. A first one of the plurality of storage electrode landing pads may be electrically coupled to a first end of the active region, and a second one of the plurality of storage electrode landing pads may be electrically coupled to a second end of the active region. Moreover, the first one of the plurality of storage electrodes on the first storage electrode landing pad may be offset relative to the active region. Moreover, a second one of the plurality of storage electrodes on the second storage electrode landing pad may be aligned with the active region.

The substrate may include a cell array area and a peripheral circuit area, and the plurality of storage electrodes may be provided on the cell array area. In addition, an interlayer insulating layer may be between the plurality of storage electrode landing pads and the substrate, and the interlayer insulating layer may extend across the cell array and peripheral circuit regions of the substrate. In addition, peripheral circuit resistors and capacitors may be on the interlayer insulating layer on the peripheral circuit region of the substrate.

According to some other embodiments of the present invention, an integrated circuit device may include a substrate, first and second bit lines on the substrate, and first and second storage electrode landing pads on the substrate. The first and second adjacent bit lines may be parallel, and the first and second storage electrode landing pads may be between the first and second bit lines. In addition, first and second storage electrodes may be respectively on portions of the first and second storage electrode landing pads. The first storage electrode may be on an end of the first storage electrode landing pad adjacent the first bit line, and the second storage electrode may be on an end of the second storage electrode landing pad adjacent the second bit line.

An insulating support layer may be on the substrate, on portions of the storage electrode landing pads that are free of the storage electrodes, and on portions of sidewalls of the first and second storage electrodes. Moreover, portions of sidewalls of the first and second storage electrodes may be free of the insulating support layer. In addition, portions of the first and second storage electrode landing pads may extend on portions of sidewalls of the respective first and second storage electrodes.

A capacitor dielectric layer may be on portions of the first and second storage electrodes, and a plate electrode may be on the capacitor dielectric layer. Moreover, the capacitor dielectric layer may be between the plate electrode and the first and second storage electrodes. The first and second storage electrode landing pads may be orthogonal with respect to the first and second bit lines.

A first active region of the substrate may be electrically coupled to the first storage electrode landing pad, and a second active region of the substrate may be electrically coupled to the second storage electrode landing pad, with the first and second active regions being separated by isolation regions of the substrate. In addition, a word line on the substrate may be orthogonal with respect to the first and second bit lines, and the wordline may cross the first and second active regions. The wordline may cross the first and second active regions at a non-orthogonal angle. The first and second storage electrodes may be respectively aligned with portions of the first and second active regions. The first and second storage electrodes may be respectively offset relative to portions of the first and second active regions.

According to still other embodiments of the present invention, an integrated circuit device may include a substrate including an active region surrounded by isolation regions. A first storage electrode landing pad may be on the substrate, and the first storage electrode landing pad may be electrically coupled to a first end of the active region. A second storage electrode landing pad may be on the substrate, and the second storage electrode landing pad may be electrically coupled to a second end of the active region. A first storage electrode my be on a portion of the first storage electrode landing pad, and the first storage electrode may be offset relative to the active region. A second storage electrode may be on a portion of the second storage electrode landing pad. The second storage electrode may be aligned relative to the active region.

In addition, a bit line on the substrate may cross the active region, and the first and second storage electrodes may be on opposite sides of the bit line. First and second word lines may cross the active region, and the first and second wordlines may cross the active region at a non-orthogonal angle.

An insulating support layer may be on the substrate, on portions of the storage electrode landing pads that are free of the storage electrodes, and on portions of sidewalls of storage electrodes, and portions of sidewalls of the storage electrodes may be free of the insulating support layer. Moreover, each of the first and second storage electrode landing pads may extend onto a portion of a sidewall of the respective first and second storage electrodes.

Each of the first and second storage electrodes may extend beyond an edge of the respective first and second storage electrode landing pads in a direction parallel to a surface of the substrate. A capacitor dielectric layer may be on portions of the first and second storage electrodes, and a plate electrode may be on the capacitor dielectric layer so that the capacitor dielectric layer is between the plate electrode and the first and second storage electrodes.

According to yet other embodiments of the present invention, a method of forming an integrated circuit device may include forming a plurality of storage electrode landing pads on a substrate, and forming an insulating support layer on the substrate and on the plurality of storage electrode landing pads. The insulating support layer may have a plurality of contact holes therein respectively exposing portions of the plurality of storage electrode landing pads. In addition, a plurality of storage electrodes may be formed on respective exposed portions of the plurality of storage electrode landing pads, and each of the plurality of storage electrodes may extend beyond the insulating support layer in a direction orthogonal to a surface of the substrate.

A capacitor dielectric layer may be formed on portions of the storage electrodes that are free of the insulating support layer, and a plate electrode may be formed on the capacitor dielectric layer and on the insulating support layer. Moreover, the capacitor dielectric layer may be between the plate electrode and the storage electrodes. Each of the storage electrode landing pads may extend onto a portion of a sidewall of the respective storage electrode, and each of the storage electrodes may extend beyond an edge of the respective storage electrode landing pad in a direction parallel to a surface of the substrate.

According to more embodiments of the present invention, a method of forming an integrated circuit device may include forming a plurality of storage electrode landing pads on a substrate, and forming an insulating support layer on the substrate and on the plurality of storage electrode landing pads. A mold layer may be formed on the insulating support layer, and a plurality of contact holes may be formed through the mold layer and the insulating support layer with each of the plurality of contact holes exposing a respective one of the plurality of storage electrode landing pads. A plurality of storage electrodes may be formed in the respective plurality of contact holes, and after forming the plurality of storage electrodes, the mold layer may be removed while maintaining the insulating support layer so that the insulating support layer is on portions of sidewalls of the plurality of storage electrodes.

After removing the mold layer, a capacitor dielectric layer may be formed on portions of the storage electrodes that are free of the insulating support layer, and a plate electrode may be formed on the capacitor dielectric layer and on the insulating support layer. Moreover, the capacitor dielectric layer may be between the plate electrode and the storage electrodes. Forming the plurality of contact holes may include removing portions of the plurality of storage electrode landing pads so that each of the storage electrode landing pads extends onto a portion of a sidewall of the respective storage electrode. Each of the storage electrodes may extend beyond an edge of the respective storage electrode landing pad in a direction parallel to a surface of the substrate.

Embodiments of the present invention may provide semiconductor integrated circuit devices including capacitors.

Embodiments of the present invention may also provide methods of manufacturing semiconductor integrated circuit devices including capacitors.

According to some embodiments of the present invention, a semiconductor integrated circuit device may include a plurality of storage nodes and a plurality of storage node landing pads. Each of the storage node landing pads may partially cover a bottom and a lower sidewall of a corresponding one of the storage nodes. An insulating support layer may fill spaces between the storage node landing pads, supporting bottom portions of the storage nodes that are not supported by the storage node landing pads, and covering the remaining portions of the lower sidewalls of the storage nodes.

According to other embodiments of the present invention, a semiconductor integrated circuit device may include a semiconductor substrate, a plurality of first and second active regions, and a plurality of word lines extending in a first direction. Two adjacent ones of the word lines may be disposed on each of the first and second active regions and each of the word lines may be shared by adjacent first and second active regions. A plurality of first and second bit lines may extend in a second direction perpendicularly intersecting the first direction, and the first and second bit lines may respectively intersect the first and second active regions at an angle greater than zero degrees. A plurality of memory cell pairs may be formed in the first and second active regions, and each of the memory cell pairs may include first and second capacitors. The first and second capacitors may include respective corresponding ones of storage nodes, respective corresponding ones of first and second storage node landing pads supporting bottoms of the storage nodes and partially covering lower sidewalls of the storage nodes, and respective corresponding portions of an insulating support layer filling spaces between the first and second storage node landing pads and covering the remaining portions of the lower sidewalls of the storage nodes. The first storage node landing pads connected to the first active regions and the second storage node landing pads connected to the second active regions may be alternately arranged in the second direction.

According to still other embodiments of the present invention, a method of manufacturing a semiconductor integrated circuit device may include forming a plurality of storage node landing pads on a semiconductor substrate, and forming an insulating support layer filling spaces between the storage node landing pads. In addition, a plurality of storage nodes may be formed in such a way that bottoms and lower sidewalls of the storage nodes are covered by the storage node landing pads and the insulating support layer.

According to further embodiments of the present invention, a method of manufacturing a semiconductor integrated circuit device may include defining a plurality of first and second active regions in a semiconductor substrate. A plurality of word lines may be formed extending in a first direction, with two adjacent ones of the word lines being disposed on each of the first and second active regions and each of the word lines may be shared by adjacent first and second active regions. A plurality of first and second bit lines may be formed extending in a second direction perpendicularly intersecting the first direction, with the first and second bit lines respectively intersecting the first and second active regions at an angle greater than zero degrees. First storage node landing pads may be formed connected to the first active regions, and second storage node landing pads may be formed connected to the second active regions, in such a way that the first and second storage node landing pads are alternately arranged in the second direction. An insulating support layer may be formed filling spaces between the first and second storage node landing pads, and a plurality of storage nodes may be formed in such a way that bottoms and lower sidewalls of the storage nodes are covered by the first and second storage node landing pads and the insulating support layer.

DETAILED DESCRIPTION

Figure 1A:
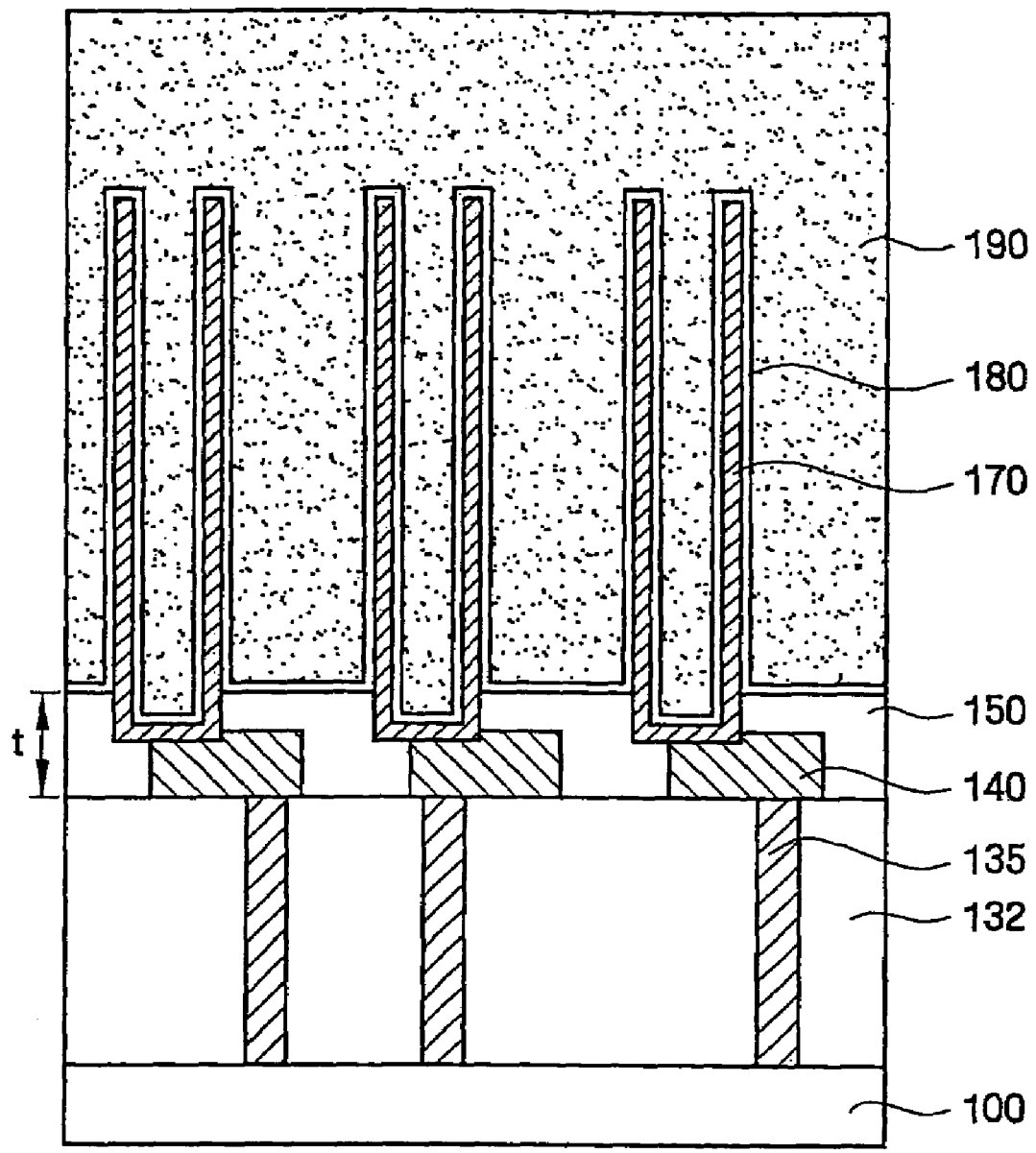
FIGS. 1A and 1B are respectively a cross sectional view and a plan view of a semiconductor integrated circuit device including capacitors according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

Figure 1B:
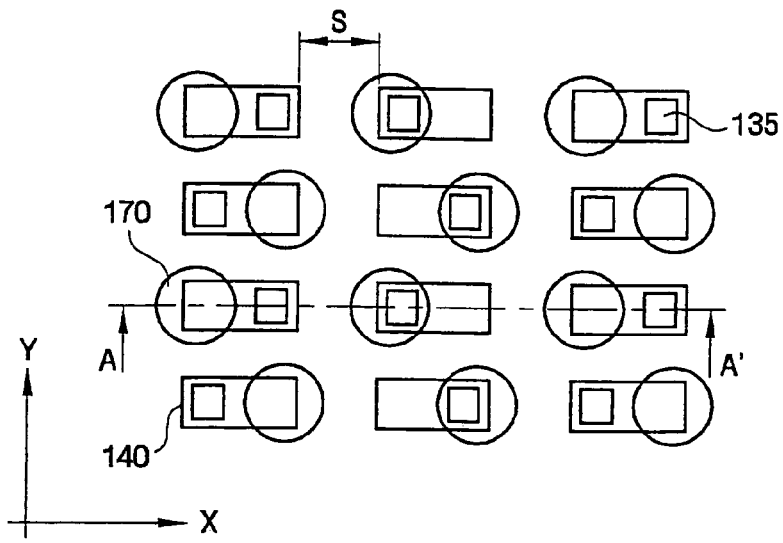

FIGS. 1A and 1B are respectively a cross sectional view and a plan view of a semiconductor integrated circuit device including capacitors according to some embodiments of the present invention. The cross section of FIG. 1A is taken along line A-A' of FIG. 1B.

Referring to FIGS. 1A and 1B, a plurality of storage nodes 170 may be arranged on a semiconductor substrate 100. The storage nodes 170 may be firmly supported by storage node landing pads 140 and an insulating support layer 150 in such a way that bottoms and lower sidewalls of the storage nodes 170 are covered by the storage node landing pads 140 and the insulating support layer 150.

The storage nodes 170 may be cylindrical storage nodes in which both inner and outer surfaces can be used as charge storage areas, but the shapes of the storage nodes 170 are not limited to the above-illustrated example. The storage nodes 170 may have a height greater than 1.4 μm (micrometer) to increase capacitance, but the height of the storage nodes 170 is not limited to the above value. The storage nodes 170 may be made of doped polysilicon or other material(s).

The storage node landing pads 140 may structured to partially cover the bottoms and lower sidewalls of respective storage nodes 170. There may be a same number of storage node landing pads 140 and storage nodes 170. Referring to FIG. 1B, the storage node landing pads 140 may be symmetrically arranged. Each storage node 170 may be electrically connected to a respective storage node landing pad 140 so that the storage nodes 170 are arranged asymmetrically with respect to the center portions of the storage node landing pads 140. By doing so with high integration of memory devices, a sufficient area to form the storage nodes 170 may be assured, and short circuits between the storage nodes 170 may be reduced. To more efficiently reduce short circuits between the storage nodes 170 and to provide a sufficient contact area between the storage nodes 170 and the storage node landing pads 140, the storage node landing pads 140 may have a rectangular or elliptical shape having a major axis along the x-axis and a minor axis along the y-axis. Of course, the direction of the major axis and the minor axis can be reversed. The storage nodes 170 may be connected to the storage node landing pads 140 in a zigzag manner along the direction of the minor axis. Therefore, short circuits between the storage nodes 170 can be more efficiently reduced.

Spaces between each of the storage node landing pads 140 may be filled with the insulating support layer 150. The insulating support layer 150 may also be formed to a predetermined thickness on upper surfaces of the storage node landing pads 140. Thus, upper portions of the storage node landing pads 140 not in contact with the storage nodes 170 may be covered with the insulating support layer 150. The insulating support layer 150 may completely cover remaining portions of the bottoms and the lower sidewalls of the storage nodes 170 that are not covered by the storage node landing pads 140 so that the storage nodes 170 may firmly stand up straight. The insulating support layer 150 can also be used as an etch stop layer during an etching process used to form the storage nodes 170. Thus, the insulating support layer 150 may be a layer including SiC, SiN, SiCN, BN, etc.

A thickness of the insulating support layer 150 may be half ($\frac{1}{2}$) or more of a maximum space S between adjacent ones of the storage node landing pads 140. By doing so, the insulating support layer 150 may completely fill the spaces S between the storage node landing pads 140 and have a smooth surface. With respect to a 256 Mbit or more DRAM device, a thickness t of the insulating support layer 150 may be at least about 800 (Angstroms).

A dielectric layer 180 and a plate node 190 may be disposed on the storage nodes 170 to form capacitors. The dielectric layer 180 and the plate node 190 may be commonly formed on the storage nodes 170. Thus, the dielectric layer 180 and the plate node 190 may extend to an upper surface of the insulating support layer 150. The dielectric layer 180 may be a single layer of a material such as tantalum oxide ($Ta_2O_5$) or aluminum oxide ($Al_2O_3$), or a stacked layer of tantalum oxide/titanium oxide or aluminum oxide/titanium oxide or other materials. The plate node 190 may be a single layer of a material such as doped polysilicon or a stacked layer, for example, including a diffusion barrier layer and a doped polysilicon layer.

The storage node landing pads 140 may be electrically connected to source regions (not shown) of transistors formed in the semiconductor substrate 100 via storage node contacts 135 through an inter-insulating layer 132.

Hereinafter, structures of a semiconductor integrated circuit device and methods of manufacturing semiconductor integrated circuit devices will be described with respect to a DRAM with a unit cell size of 6.6 F2 and having a capacitor structure as illustrated in FIGS. 1A and 1B.

Figure 2A:
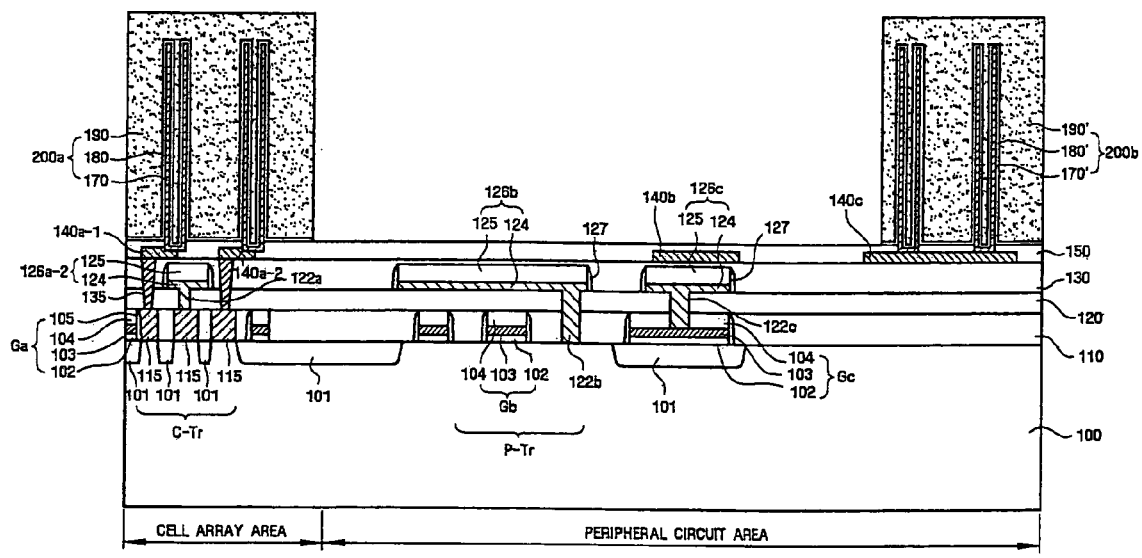
FIGS. 2A, 2B, and 2C are respectively a cross sectional view, a plan view, and an equivalent circuit diagram illustrating an application of a capacitor structure shown in FIGS. 1A and 1B to a Dynamic Random Access Memory (DRAM) with a unit cell size of 6.6 F2 according to some embodiments of the present invention.
Figure 2B:
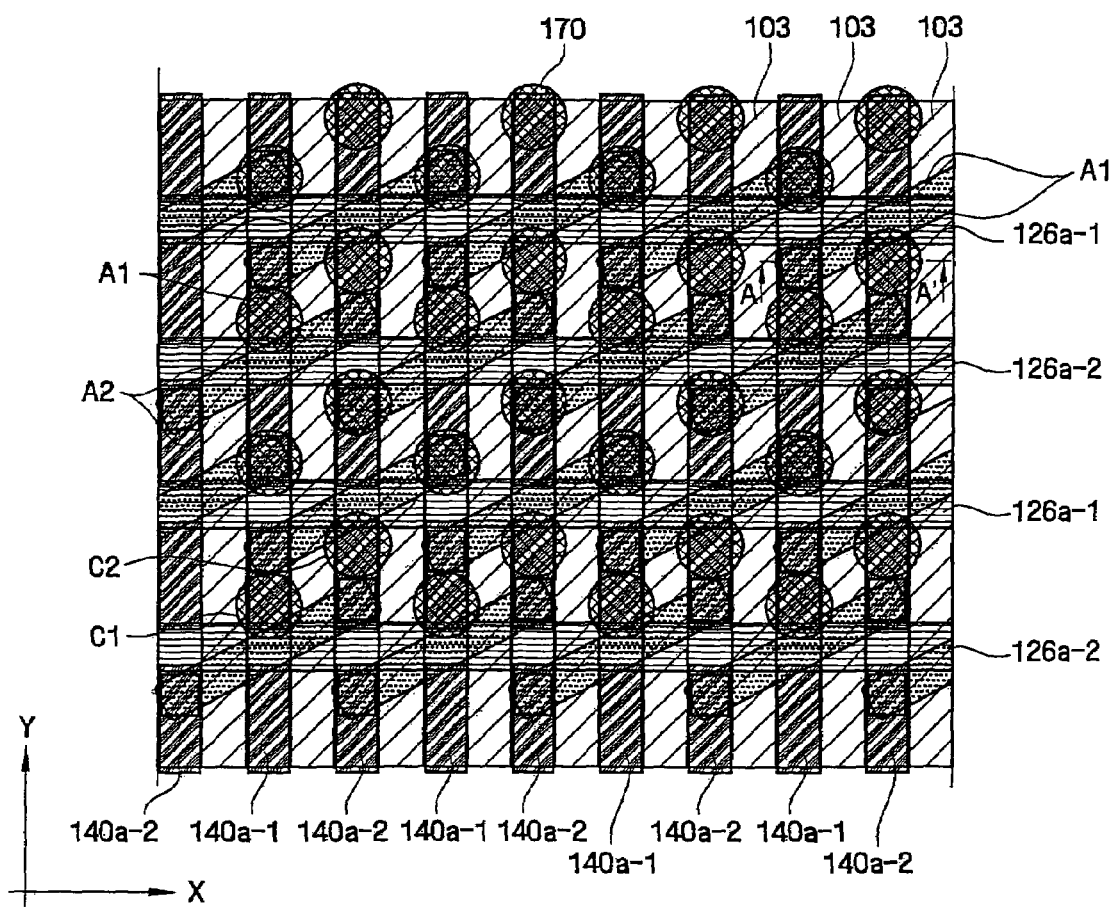
Figure 2C:
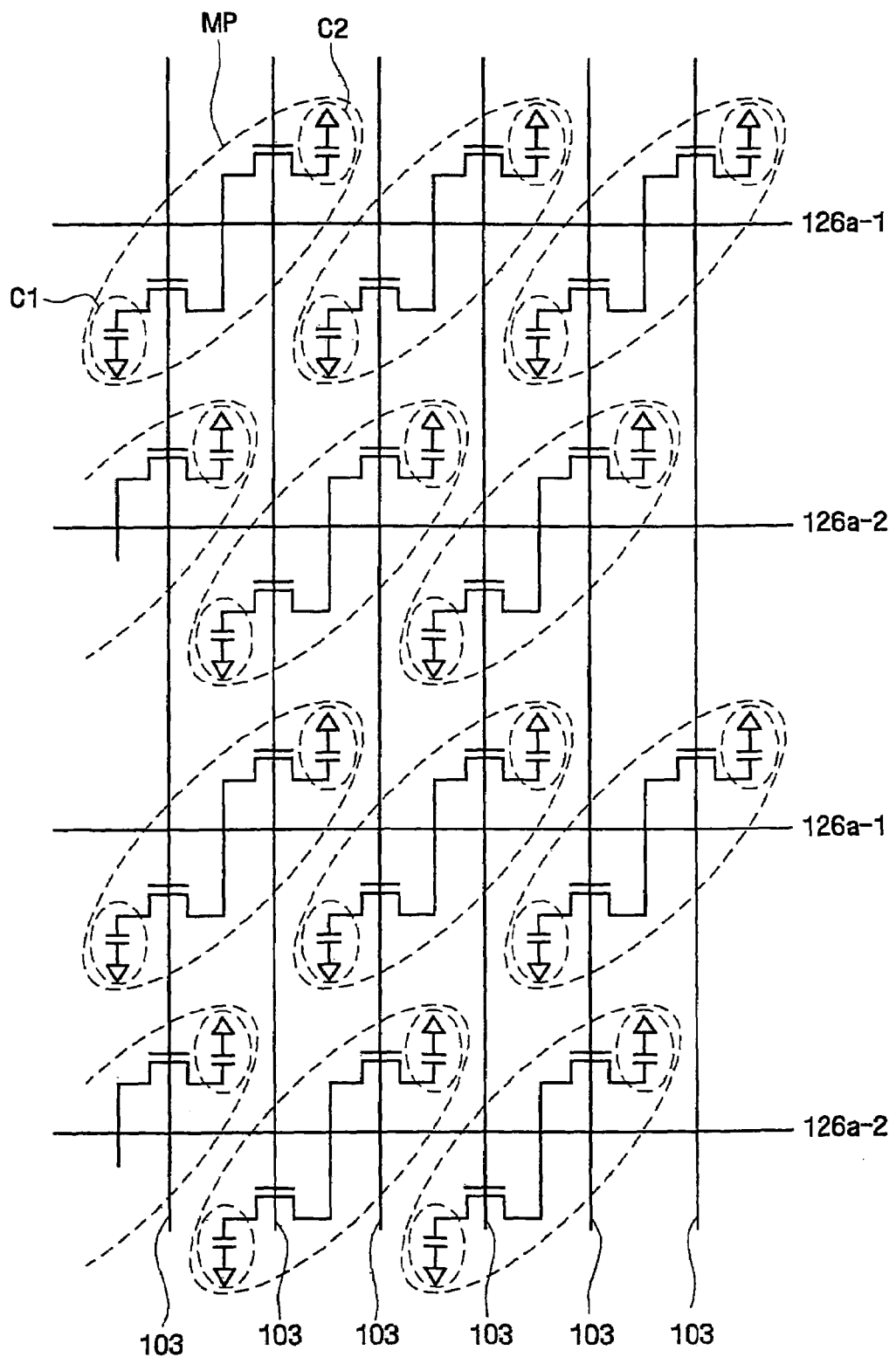

FIGS. 2A, 2B, and 2C are respectively a cross sectional view, a plan view, and a partial equivalent circuit view illustrating an application of capacitor structures of FIGS. 1A and 1B to a DRAM with a unit cell size of 6.6 F2. The sectional view of FIG. 2A illustrates both a cell array area and a peripheral circuit area, and the plan view and the partial equivalent circuit view of FIGS. 2B and 2C illustrate only a cell array area.

Referring to FIGS. 2A through 2C, a plurality of first and second active regions A1 and A2 are defined by device isolation regions 101 in a semiconductor substrate 100. A plurality of word lines 103 extend in a first direction, i.e., in the y-axis direction. Two adjacent ones of the word lines 103 are disposed on each of the first and second active regions A1 and A2, and each of the word lines is shared by adjacent first and second active regions A1 and A2. First and second bit lines 126a-1 and 126a-2 extend in a second direction perpendicularly intersecting the first direction, i.e., in the x-axis direction. The first bit lines 126a-1 and the second bit lines 126a-2 are alternately arranged. The first bit lines 126a-1 and the second bit lines 126a-2 respectively intersect the first active regions A1 and the second active regions A2 at an angle greater than zero degrees.

A memory cell pair MP is formed in each of the first and second active regions A1 and A2. The memory cell pair MP includes a first capacitor C1 and a second capacitor C2. Each of the first capacitor C1 and the second capacitor C2 includes respective corresponding ones of storage nodes 170, and respective corresponding ones of first and second storage node landing pads 140*a*-1 and 140*a*-2 supporting the bottoms of the storage nodes 170 and partially covering the lower sidewalls of the storage nodes 170. Respective corresponding portions of an insulating support layer 150 may fill spaces between the first and second storage node landing pads 140*a*-1 and 140*a*-2 and cover the remaining portions of the lower sidewalls of the storage nodes 170. The first storage node landing pads 140*a*-1 connected to the first active regions A1 and the second storage node landing pads 140*a*-2 connected to the second active regions A2 may be alternately arranged in the second direction, i.e., in the x-axis direction.

As described above with reference to FIGS. 1A and 1B, lower portions of the first and second storage node landing pads 140*a*-1 and 140*a*-2 not in contact with the storage nodes 170 may be covered with the insulating support layer 150. The first and second storage node landing pads 140*a*-1 and 140*a*-2 may be arranged along the second direction (the x-axis direction) in substantially the same pitch as the word lines 103. As a result, the first and second storage node landing pads 140*a*-1 and 140*a*-2 may be symmetrically arranged with respect to the x-axis and y-axis. Meanwhile, each of the first and second storage node landing pads 140*a*-1 and 140*a*-2 may have a major axis and a minor axis, and the storage nodes 170 may be arranged in a zigzag manner along the direction of the minor axis, i.e., the x-axis. Thus, the storage nodes 170 may be electrically connected to the first and second storage node landing pads 140*a*-1 and 140*a*-2 in an asymmetrical arrangement with respect to center portions of the first and second storage node landing pads 140*a*-1 and 140*a*-2.

A dielectric layer 180 and a plate node 190 may be disposed on the storage nodes 170 to form capacitors 200*a*. The dielectric layer 180 and the plate node 190 may be commonly formed on the storage nodes 170. Thus, the dielectric layer 180 and the plate node 190 may extend to an upper surface of the insulating support layer 150.

Meanwhile, inter-insulating layers 110, 120, and 130 (covering the word lines 103) may be disposed below the insulating support layer 150. The first and second storage node landing pads 140*a*-1 and 140*a*-2 may electrically connect the first and second active regions A1 and A2 and the storage nodes 170 via storage node contacts 135 through the inter-insulating layers 130 and 120 and via self-aligned contacts 115 connected to the storage node contacts 135 and self-aligned with respect to the word lines 103, the overlying capping insulating films 104, and spacers 105 to expose the first and second active regions A1 and A2. The storage node contacts 135 are electrically connected to the first and second storage node landing pads 140*a*-1 and 140*a*-2 asymmetrically with respect to center portions of the first and second storage node landing pads 140*a*-1 and 140*a*-2.

Meanwhile, various peripheral circuit transistors P-Tr may be provided in the peripheral circuit area. The peripheral circuit area may include resistors 140*b* at the same level as the first and second storage node landing pads 140*a*-1 and 140*a*-2 of the cell array area. The peripheral circuit area may also include storage node patterns 140*c* at the same level as the first and second storage node landing pads 140*a*-1 and 140*a*-2 of the cell array area. In addition the peripheral circuit area may include capacitors 200*b* including storage nodes 170' at the same level as the storage nodes 170 of the cell array area, a dielectric layer 180' at the same level as the dielectric layer 180 of the cell array area, and a plate node 190' at the same level as the plate node 190 of the cell array area. The capacitors 200*b* of the peripheral circuit area may be used as power capacitors.

Figure 3:
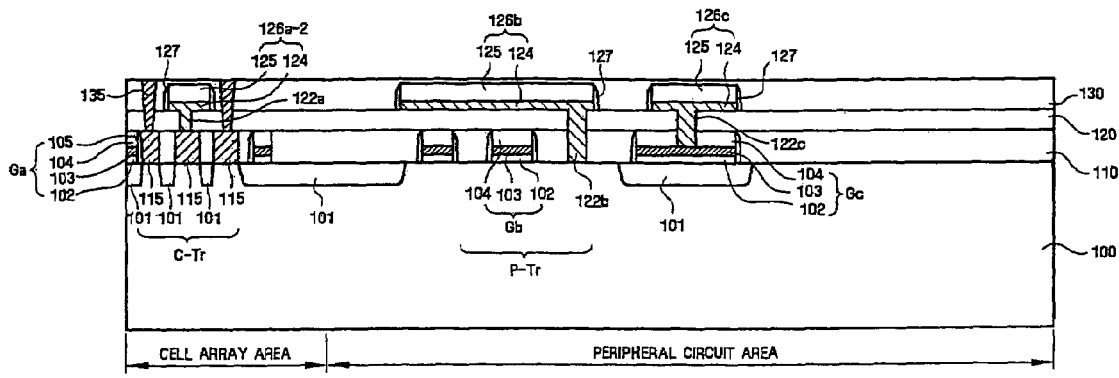
FIGS. 3 through 7 are cross sectional views illustrating sequential steps of manufacturing a DRAM as shown in FIGS. 2A through 2C according to embodiments of the present invention.

Hereinafter, a method of manufacturing DRAMs as shown in FIGS. 2A through 2C will be described with reference to FIGS. 3 through 7. FIG. 3 is a cross sectional view illustrating an intermediate structure with completed storage node contacts 135.

Referring to FIG. 3, a substrate 100 including active regions defined by device isolation regions 101 may be prepared. The device isolation regions 101 may be formed as Shallow Trench Isolation (STI) regions. The STI regions may be formed by forming shallow trenches to a depth in the range of about 3000 (Angstroms) to about 4000 (Angstroms) in the substrate 100, followed by filling the shallow trenches with oxide providing relatively good filling characteristics and planarization. Cell transistors C-Tr and peripheral circuit transistors P-Tr may be respectively formed in a cell array area and a peripheral circuit area of the substrate 100 using a Complementary Metal Oxide Semiconductor (CMOS) process. In detail, well regions (not shown) may be formed by ion implantation with n-type and/or p-type impurities. Then, a gate insulating layer 102, a gate conductive layer 103, and a capping insulating layer 104 may be sequentially deposited and patterned into gate electrodes Ga, Gb, and Gc. Ion implantation may then be used to form low-concentration source/drain regions (not shown) and halo regions (not shown) in the substrate 100. Then, a spacer 105 may be formed on sidewalls of the gate electrodes Ga, Gb, and Gc and then ion implantation may be used to form high-concentration source/drain regions (not shown) in the substrate 100 to thereby form the cell transistors C-Tr and the peripheral circuit transistors P-Tr.

Next, a first inter-insulating layer 110 may be formed on an entire surface of the substrate 100 using a material providing step coverage characteristics. Then, contacts 115 may be self-aligned with respect to the capping insulating layer 104 and the spacer 105 of the gate electrode Ga and may be connected to source and drain regions of the cell transistors C-Tr through the first inter-insulating layer 110. The self-aligned contacts 115 may be made of doped polysilicon and/or other material(s).

Next, a second inter-insulating layer 120 may be formed using high-density plasma oxide and then anisotropically etched to form a plurality of contact holes. The contact holes may be filled with a diffusion barrier material such as TiN and a metal such as W, followed by planarization, to form bit line contacts 122*a* connected to the self-aligned contacts 115 which are connected to the drain regions of the cell transistors C-Tr, and to form peripheral circuit contacts 122*b* and cell pad contacts 122*c* connected to the drain regions of the peripheral circuit transistors P-Tr.

Next, first bit lines (see 126*a*-1 of FIG. 2B) and second bit lines 126*a*-2 may be connected to the bit line contacts 122*a*, and wires 126*b* and 126*c* may be respectively connected to the peripheral circuit contacts 122*b* and the cell pad contacts 122*c*. The first bit lines 126*a*-1, the second bit lines 126*a*-2, and the wires 126*b* and 126*c* may each include a conductive layer 124 and a hard mask 125. The conductive layer 124 may include a diffusion barrier layer (such as a layer of TiN) and a metal layer (such as a layer of W). Sidewall spacer 127 may be formed on sidewalls of the first bit lines 126*a*-1, the second bit lines 126*a*-2, and the wires 126*b* and 126*c*.

After forming the first bit lines 126*a*-1 and the second bit lines 126*a*-2, a third inter-insulating layer 130 may be formed. The storage node contacts 135 may be connected to the self-aligned contacts 115 which are connected to the source regions of the cell transistors C-Tr. The storage note contacts may be formed in the third and second inter-insulating layers 130 and 120. The storage node contacts 135 may be made of doped polysilicon and/or other conductive material(s).

Figure 4:
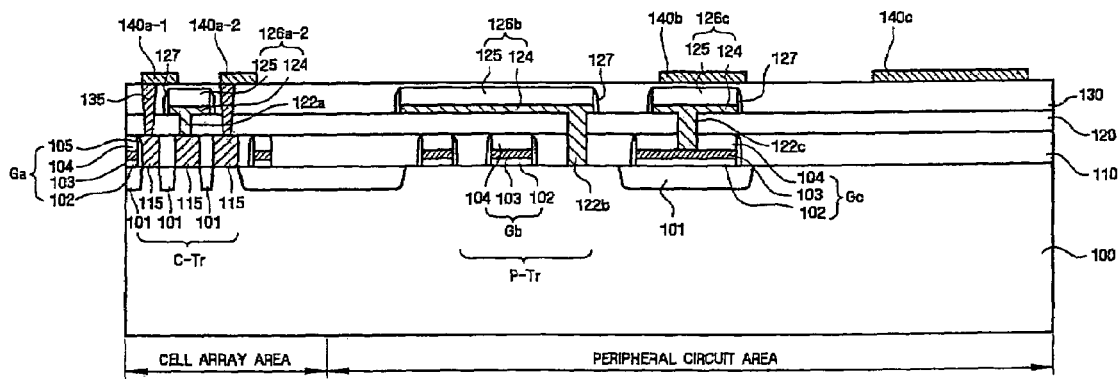

FIG. 4 is a cross sectional view illustrating an intermediate structure including first and second storage node landing pads 140a-1 and 140a-2. Referring to FIG. 4, a conductive layer may be formed on an entire surface of the substrate 100 on which the storage node contacts 135 are formed, followed by patterning, to form the first and second storage node landing pads 140a-1 and 140a-2 connected to the storage node contacts 135 in the cell array area. At this time, resistors 140b, and/or storage node patterns 140c (serving as storage nodes of power capacitors) may be optionally formed in the peripheral circuit area.

Figure 5:
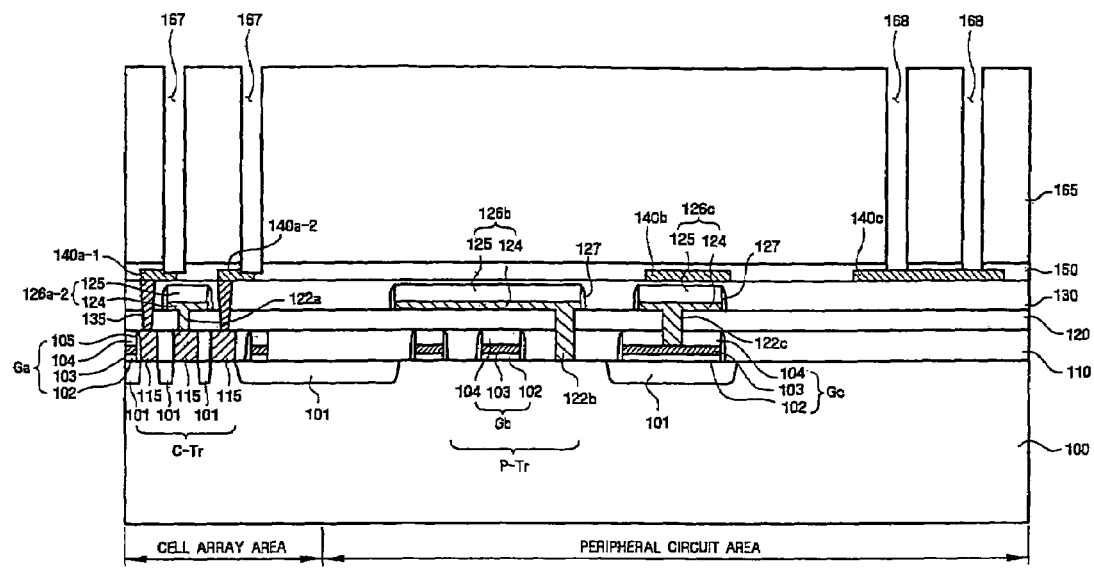

FIG. 5 is a cross sectional view illustrating an intermediate structure including an insulating support layer 150, and molds 165 used to form storage nodes (also referred to as electrodes). Referring to FIG. 5, the insulating support layer 150 may be formed to completely fill spaces between the first and second storage node landing pads 140a-1 and 140a-2. For this, the insulating support layer 150 may be formed to a thickness of at least about half (½) of a maximum space between adjacent ones of the first and second storage node landing pads 140a-1 and 140a-2. That is, the insulating support layer 150 may be formed to a thickness of at least about half (½) of a maximum space between adjacent ones of the first and second storage node landing pads 140a-1 and 140a-2, and the insulating support layer may have a smooth surface.

Next, the resulting structure may be completely covered with an inter-insulating layer, and a photoresist pattern (defining a storage node pattern as shown in FIG. 2B) may be formed on the inter-insulating layer. Then, the inter-insulating layer may be etched using the photoresist pattern as an etching mask to form the molds 165, and the insulating support layer 150 may then be etched to expose the first and second storage node landing pads 140a-1 and 140a-2. When etching the insulating support layer 150, overetch may occur. Thus, storage node-forming openings 167 defined by the molds 165 may extend to a predetermined depth from surfaces of the first and second storage node landing pads 140a-1 and 140a-2.

The inter-insulating layer used to form the molds 165 may be formed for example, as a single oxide layer made of PE-TEOS (Plasma Enhanced Tetra Ethyl Ortho Silicate), HDP (High Density Plasma), or P—$SiH_4$, or as a double layer including an impurity-doped oxide layer made of BPSG (Boron Phosphorus Silicate Glass) or PSG (Phosphorus Silicate Glass) and an undoped oxide layer made of PE-TEOS, HDP, or P—$SiH_4$.

When the inter-insulating layer used to form the molds 165 is formed as a single layer, a dry etching process may be used to form holes 167 and 168. When the inter-insulating layer used to form the molds 165 is formed as a double layer, a combination of dry etching and wet etching may be used to form holes 167 and 168. The dry etching may be performed using a CFx-based etching gas such as $C_4F_6$ and/or $C_3F_8$. During the etching used to form the molds 165, the insulating support layer 150 may serve as an etch stop layer. Thus, the insulating support layer 150 may be made of a material with higher etching selectivity with respect to the inter-insulating layer used to form the molds 165, e.g., SiN, SiC, SiCN, or BN.

After etching the inter-insulating layer used to form the molds 165, a portion of the insulating support layer 150 exposed through the openings 167 defined by the molds 165 may be etched using an etching gas such as $CF_4$ and/or $CHF_3$. At this time, overetch may be provided so that the exposed portion of the insulating support layer 150 may be completely removed, and upper surfaces of the first and second storage node landing pads 140a-1 and 140a-2 are stably exposed. As a result, portions of the first and second storage node landing pads 140a-1 and 140a-2 exposed through the openings 167 may be etched to a predetermined depth, whereby the first and second storage node landing pads 140a-1 and 140a-2 have a stepped upper surface. Meanwhile, in order to form power capacitors in the peripheral circuit area, openings 168 exposing the storage node patterns 140c may be formed in the molds 165.

Figure 6:
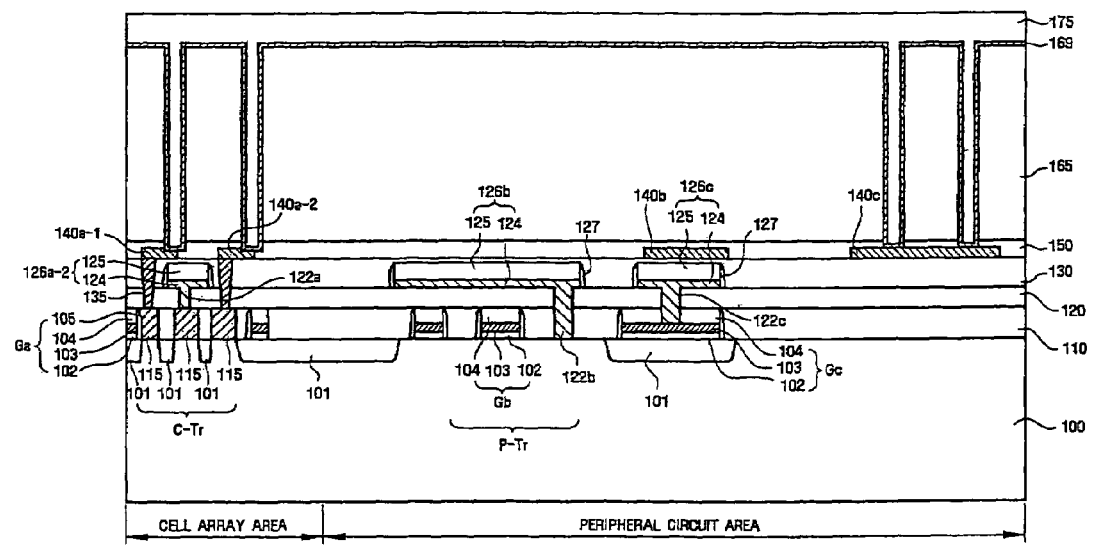

Referring to FIG. 6, a conductive layer 169 used to form storage nodes may be conformally formed along the sidewalls and upper surfaces of the molds 165. The conductive layer 169 may be made of doped polysilicon to increase conductivity. The conductive layer 169 may be formed to a thickness in the range of about 300 (Angstroms) to about 600 (Angstroms). When a desired height of the storage nodes is about 1.6 μm (micrometer), the conductive layer 169 may be formed to a thickness of about 450 (Angstroms). Then, an insulating layer 175 may be deposited on the entire surface of the resultant structure using a material with gap filling characteristics such as BPSG, PSG, or USG (Undoped Silicate Glass).

Figure 7:
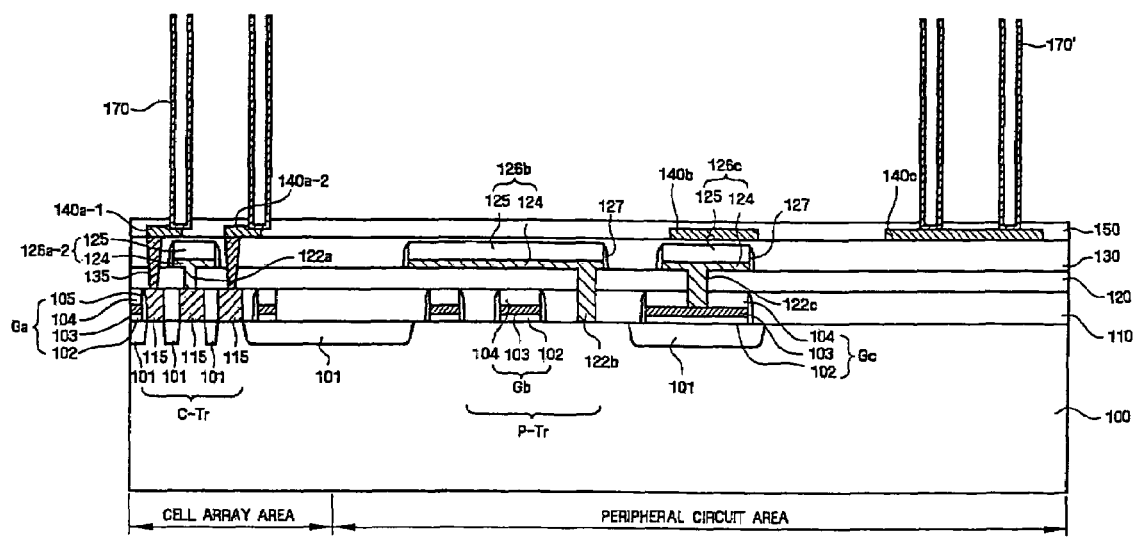

Referring to FIG. 7, portions of the insulating layer 175 and the conductive layer 169 on upper surfaces of the molds 165 may be removed by a Chemical Mechanical Polishing (CMP) process or a dry etch-back process, and the molds 165 and the remaining portion of the insulating layer 175 may be removed using a wet etching solution to complete storage nodes 170, 170', each of which may have a "one cylinder stack" structure in a unit cell. The bottoms and lower sidewalls of the storage nodes 170, 170' may be completely covered by the first and second storage node landing pads 140a-1 and 140a-2 and the insulating support layer 150. Therefore, collapse of the storage nodes 170, 170' can be effectively reduced.

Next, referring again to FIG. 2A, a dielectric film used to form a dielectric layer 180 may be formed on the entire surface of the substrate 100 including the storage nodes 170, 170'. The dielectric film may be a single layer of tantalum oxide ($Ta_2O_5$) or a aluminum oxide ($Al_2O_3$), or a stacked layer including tantalum oxide/titanium oxide or aluminum oxide/titanium oxide. Then, a conductive layer used to form a plate node 190 may be formed. The conductive layer may be a single layer made of doped polysilicon or a stacked layer including a diffusion barrier layer and a doped polysilicon layer. The diffusion barrier layer may be formed to a thickness in the range of about 300 Å (Angstroms) to about 400 Å (Angstroms) using Chemical Vapor Deposition (CVD) using TiN, and the doped polysilicon layer may be formed to a thickness in the range of about 2,000 Å (Angstroms) to about 3,000 Å (Angstroms) by Low-Pressure CVD (LPCVD) at a temperature in the range of about 600° C. (degrees C.) to about 700° C. (degrees C.) using a reaction gas such as $SiH_4$ or $Si_2H_6$ and a doping gas such as $PH_3$. Then, the conductive layer and the dielectric film may be patterned to complete cell capacitors 200a including the plate node 190 and the underlying dielectric layer 180. Capacitors 200b including a plate node 190' and the underlying dielectric layer 180' may also be optionally formed in the peripheral circuit area.

Subsequent processes known in those of ordinary skill in the semiconductor device technology field may be performed. These subsequent processes may include forming wires through which electrical signals are input into or output from transistors in a cell array area and a peripheral circuit area; forming a passivation layer on a substrate; and/or substrate packaging, to thereby complete a DRAM.

FIGS. 2A through 7 illustrate a DRAM with a unit cell size of 6.6 $F^2$. However, it should be understood by those of ordinary skill in the art that a capacitor structure illustrated with reference to FIGS. 1A and 1B can also be applied to DRAMs with various unit cell sizes, e.g., DRAMs with unit cell size of 8 F² or 4 F². Furthermore, the capacitor structure illustrated with reference to FIGS. 1A and 1B may be diversely applied to a System-on-Chip (SoC) including a single DRAM or an embedded DRAM.

In a semiconductor integrated circuit device including capacitors according to embodiments of the present invention, storage nodes may be completely supported by storage node landing pads and an insulating support layer, thereby reducing collapse of the storage nodes.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An integrated circuit device comprising:
   a substrate;
   a plurality of storage electrode landing pads on the substrate, wherein each of the plurality of storage electrode landing pads have major axis and minor axis;
   a plurality of storage electrodes with each of the plurality of storage electrodes being on a respective first portion of a respective one of the plurality of storage electrode landing pads wherein second portions of the storage electrode landing pads are free of the storage electrodes;
   an insulating support layer on the substrate, on the second portions of the storage electrode landing pads that are free of the storage electrodes, and on first portions of sidewalls of the storage electrodes, wherein second portions of the sidewalls of the storage electrodes are free of the insulating support layer, wherein the first portions of the sidewalls of the storage electrodes are free of the storage electrode landing pads; and
   first and second adjacent bit lines on the substrate wherein the first and second adjacent bit lines are parallel;
   wherein the plurality of storage electrode landing pads include first and second adjacent storage electrode landing pads between the first and second adjacent bit lines, wherein a first one of the plurality of storage electrodes is on an end of the first storage electrode landing pad adjacent the first bit line, and wherein a second one of the plurality of storage electrodes is on an end of the second storage electrode landing pad adjacent the second bit line,
   wherein the first and second bit lines extend in a direction of the minor axis of the storage electrode landing pads.

2. An integrated circuit device according to claim 1 wherein the first and second storage electrode landing pads are orthogonal with respect to the first and second adjacent bit lines.

3. An integrated circuit device according to claim 1 further comprising:
   a first active region of the substrate electrically coupled to the first storage electrode landing pad;
   a second active region of the substrate electrically coupled to the second storage electrode landing pad, wherein the first and second active regions are separated by isolation regions of the substrate; and
   a word line on the substrate wherein the wordline is orthogonal with respect to the first and second bit lines and wherein the wordline crosses the first and second active regions.

4. An integrated circuit device according to claim 3 wherein the wordline crosses the first and second active regions at a non-orthogonal angle.

5. An integrated circuit device according to claim 3 wherein the first and second storage electrodes are respectively offset relative to portions of the first and second active regions.

6. An integrated circuit device according to claim 1 wherein the substrate includes a cell array area and a peripheral circuit area, wherein the plurality of storage electrodes are provided on the cell array area, the integrated circuit device further comprising:
   an interlayer insulating layer between the plurality of storage electrode landing pads and the substrate wherein the interlayer insulating layer extends across the cell array and peripheral circuit regions of the substrate; and
   peripheral circuit resistors and/or capacitors on the interlayer insulating layer on the peripheral circuit region of the substrate.

7. An integrated circuit device comprising:
   a substrate;
   a plurality of storage electrode landing pads on the substrate;
   a plurality of storage electrodes with each of the plurality of storage electrodes being on a respective first portion of a respective one of the plurality of storage electrode landing pads wherein second portions of the storage electrode landing pads are free of the storage electrodes;
   an insulating support layer on the substrate, on the second portions of the storage electrode landing pads that are free of the storage electrodes, and on first portions of sidewalls of the storage electrodes, wherein second portions of the sidewalls of the storage electrodes are free of the insulating support layer, wherein the first portions of the sidewalls of the storage electrodes are free of the storage electrode landing pads; and
   first and second adjacent bit lines on the substrate wherein the first and second adjacent bit lines are parallel;
   wherein the plurality of storage electrode landing pads include first and second adjacent storage electrode landing pads between the first and second adjacent bit lines, wherein a first one of the plurality of storage electrodes is on an end of the first storage electrode landing pad adjacent the first bit line, and wherein a second one of the plurality of storage electrodes is on an end of the second storage electrode landing pad adjacent the second bit line;
   a first active region of the substrate electrically coupled to the first storage electrode landing pad;
   a second active region of the substrate electrically coupled to the second storage electrode landing pad, wherein the first and second active regions are separated by isolation regions of the substrate; and
   a word line on the substrate wherein the wordline is orthogonal with respect to the first and second bit lines and wherein the wordline crosses the first and second active regions;
   wherein the first and second storage electrodes are respectively aligned with portions of the first and second active regions.

8. An integrated circuit device comprising:
   a substrate;
   first and second adjacent bit lines on the substrate wherein the first and second adjacent bit lines are parallel;
   first and second storage electrode landing pads on the substrate wherein the first and second storage electrode landing pads are between the first and second adjacent bit lines, wherein the first and second storage electrode landing pads has a major axis and a minor axis;

first and second storage electrodes respectively on first portions of the first and second storage electrode landing pads, wherein second portions of the first and second storage electrode landing pads are free of the first and second storage electrodes, wherein the first storage electrode is on an end of the first storage electrode landing pad adjacent the first bit line, and wherein the second storage electrode is on an end of the second storage electrode landing pad adjacent the second bit line; and an insulating support layer on the substrate, on the second portions of the storage electrode landing pads that are free of the first and second storage electrodes, and on first portions of sidewalls of the first and second storage electrodes, wherein second portions of the sidewalls of the first and second storage electrodes are free of the insulating support layer;

wherein the first and second adjacent bit lines extend in a direction of the minor axis of the first and second storage electrode landing pads.

9. An integrated circuit device according to claim 8 further comprising:

a capacitor dielectric layer on the second portions of the sidewalls of the first and second storage electrodes; and a plate electrode on the capacitor dielectric layer wherein the capacitor dielectric layer is between the plate electrode and the first and second storage electrodes.

10. An integrated circuit device according to claim 8 wherein the first and second storage electrode landing pads are orthogonal with respect to the first and second bit lines.

11. An integrated circuit device according to claim 8 further comprising:

a first active region of the substrate electrically coupled to the first storage electrode landing pad;

a second active region of the substrate electrically coupled to the second storage electrode landing pad, wherein the first and second active regions are separated by isolation regions of the substrate; and a word line on the substrate wherein the wordline is orthogonal with respect to the first and second bit lines and wherein the wordline crosses the first and second active regions.

12. An integrated circuit device according to claim 11 wherein the wordline crosses the first and second active regions at a non-orthogonal angle.

13. An integrated circuit device according to claim 11 wherein the first and second storage electrodes are respectively offset relative to portions of the first and second active regions.

14. An integrated circuit device comprising:

a substrate;

first and second adjacent bit lines on the substrate wherein the first and second adjacent bit lines are parallel;

first and second storage electrode landing pads on the substrate wherein the first and second storage electrode landing pads are between the first and second bit lines, wherein each of the first and second storage electrode landing pads has a major axis and a minor axis; and first and second storage electrodes respectively on first portions of the first and second storage electrode landing pads, wherein second portions of the first and second storage electrode landing pads are free of the storage electrodes, wherein the first storage electrode is on an end of the first storage electrode landing pad adjacent the first bit line, and wherein the second storage electrode is on an end of the second storage electrode landing pad adjacent the second bit line;

wherein portions of the first and second storage electrode landing pads extend on portions of sidewalls of the respective first and second storage electrodes;

wherein the first and second adjacent bit lines extend in a direction of the minor axis of the first and second storage electrode landing pads.

15. An integrated circuit device according to claim 14 further comprising:

an insulating support layer on the substrate, on the second portions of the storage electrode landing pads that are free of the storage electrodes, and on first portions of sidewalls of the first and second storage electrodes, wherein second portions of the sidewalls of the first and second storage electrodes are free of the insulating support layer.

16. An integrated circuit device comprising:

a substrate;

first and second bit lines on the substrate wherein the first and second adjacent bit lines are parallel;

first and second storage electrode landing pads on the substrate wherein the first and second storage electrode landing pads are between the first and second bit lines;

first and second storage electrodes respectively on portions of the first and second storage electrode landing pads, wherein the first storage electrode is on an end of the first storage electrode landing pad adjacent the first bit line, and wherein the second storage electrode is on an end of the second storage electrode landing pad adjacent the second bit line;

a first active region of the substrate electrically coupled to the first storage electrode landing pad;

a second active region of the substrate electrically coupled to the second storage electrode landing pad, wherein the first and second active regions are separated by isolation regions of the substrate; and a word line on the substrate wherein the wordline is orthogonal with respect to the first and second bit lines and wherein the wordline crosses the first and second active regions;

wherein the first and second storage electrodes are respectively aligned with portions of the first and second active regions.

* * * * *